(12) United States Patent
Cadieux

(10) Patent No.: US 7,318,211 B2
(45) Date of Patent: Jan. 8, 2008

(54) METHOD FOR PHYSICAL PLACEMENT OF AN INTEGRATED CIRCUIT BASED ON TIMING CONSTRAINTS

(75) Inventor: Stephen Cadieux, Kanata (CA)

(73) Assignee: Cisco Technology, Inc., San Jose, CA (US)

( * ) Notice: Subject to any disclaimer, the term of this patent is extended or adjusted under 35 U.S.C. 154(b) by 245 days.

(21) Appl. No.: 11/219,897

(22) Filed: Sep. 6, 2005

(65) Prior Publication Data

US 2007/0055952 A1   Mar. 8, 2007

(51) Int. Cl.
*G06F 17/50* (2006.01)
(52) U.S. Cl. .................. 716/10; 716/8; 716/9
(58) Field of Classification Search ............ 716/10, 716/9, 8, 6, 5, 4
See application file for complete search history.

(56) References Cited

U.S. PATENT DOCUMENTS 6,845,494 B2   1/2005   Burks et al.

*Primary Examiner*—Sun James Lin
(74) *Attorney, Agent, or Firm*—Trellis Intellectual Property Law Group, PC

(57) ABSTRACT

A method, system, apparatus, and machine-readable medium for physical placement of an integrated circuit based on the timing constraints are provided. The method involves a two-pass physical placement technique. After the first pass of the physical placements of the blocks and the top level, the timing results of the top level and of each block are analyzed. The method involves the computation of latency per gate per unit area (LPGA) of the block ports of each block. Based on the calculated LPGA, the timing constraints of the blocks are updated. The second pass of physical placement is performed, based on the updated timing constraints.

16 Claims, 5 Drawing Sheets

METHOD FOR PHYSICAL PLACEMENT OF AN INTEGRATED CIRCUIT BASED ON TIMING CONSTRAINTS

BACKGROUND OF THE INVENTION

1. Field of Invention

Embodiments of the invention relate in general to Integrated Circuits (ICs). More specifically, the embodiments of the invention relate to methods and systems for physical placement of an integrated circuit based on the timing constraints of the integrated circuit.

2. Description of the Background Art

Designing an integrated circuit with millions of logic gates is a complex operation. While performing physical placement of an IC, timing closure is performed iteratively to obtain optimal timing performance. Timing closure can be defined as a process by which timing results on all paths in the IC are met according to standards as defined by the IC technology used and the product specifications. Timing closure becomes a challenging task for an IC with millions of logic gates. A part of the timing closure task involves timing budget allocation on various paths in the IC and further satisfying these timing budgets. A timing budget is a distribution of the available time for a signal to reach from a first node in a path to a second node in the path. Timing budget allocation includes development of timing constraints for the paths in the IC. Various techniques are available for facilitating timing budget allocation.

Conventional techniques may involve methods that assign every Input/Output (I/O) port a fixed delay or a fixed percentage of the clock period while writing block level timing constraints for the IC. When these conventional techniques are applied globally in the IC design, the timing budget allocation may not be precise and result in non-optimal timing results. Therefore, the conventional techniques may not predict the timing performance of the individual paths precisely. As a result, the individual paths may be over-constrained or under-constrained. An over-constrained path can be a path for which timing constraints are tighter than what can be fulfilled by a placement/synthesis tool. In the process of placing over-constrained paths, the placement/synthesis tool will waste time trying to meet unachievable timing constraints. Further, the placement/synthesis tool will also work harder than necessary on a path that could negatively affect other paths. Therefore, the task of fulfilling the timing constraints for an over-constrained path by the synthesis tool can be unnecessarily time consuming. Furthermore, an under-constrained path can be a path for which timing constraints are more lenient than what can be fulfilled by the placement/synthesis tool. Therefore, if a large number of paths are under-constrained, then the synthesis tool might quit the task of creating optimal timing results pre-maturely, considering the improvements made by this task to be insignificant in the overall timing performance. Further, while timing an inter-block path that has under-constrained block level timing constraints, the timing constraints for the block level may be satisfied but the timing constraints for the top level may not be satisfied, resulting in failing timing results for the top level. Therefore, the timing performance of a path in the IC is not optimized due to over-constrained and under-constrained paths.

Other conventional techniques may involve manual writing of timing constraints for the IC. But writing the timing constraints and analyzing the timing performance manually for tens or hundreds of thousands of paths in the IC is a cumbersome task. Conventional techniques try to reduce the number of required constraints by treating each bit of a data bus in the same way, i.e., the entire data bus is treated as a single timing problem. However, equal treatment of all bits may not result in an optimal solution since each bit may have a different level of combinational logic processing, depending on the design of the IC.

Various Electronic Design Automation (EDA) tools are used to perform top-level timing closure. The problem with such EDA tools is that they may provide top-level timing correction only for an inter-block path, which is failing to operate according to timing constraints. Moreover, this timing correction may only be a best-effort timing correction as it may not be able to modify the placement of certain elements in a path of the IC. Further, these tools may not consider the slack available anywhere else in the design for timing budget allocation. Therefore, using only existing EDA tools alone may result in non-optimal timing budget allocation and therefore non-optimal timing results.

DETAILED DESCRIPTION OF EMBODIMENTS OF THE INVENTION

Various embodiments of the invention provide a method, a system, and an apparatus for physical placement of an integrated circuit based on timing constraints. The method involves a two-pass physical placement technique, which results in the optimal placement of all inter-block paths in the IC. After the first pass of the physical placement of the blocks and the top level, the timing results of the top level and of each block are analyzed. The method involves the computation of latency per gate per unit area (LPGA) of each block port of each block in the IC. Based on the calculated LPGA, the timing constraints of the blocks are updated. The second pass of physical placement is performed, based on the updated timing constraints.

A timing budget is a distribution of the available time for a signal to reach from a first node in a path to a second node in the path. Examples of node may include a flip-flop (FF), a logic gate, and the like. Various timing budgets can exist for various inter-block paths. An inter-block path can be a path that connects a source block and a sink block in the IC. The inter-block path further comprises at least three portions: source block portion, top-level portion, and sink block portion. The timing budget can be distributed between the top-level portion and the block portions of an inter-block path. To obtain the maximum performance from the inter-block path, timing constraints related to source and sink blocks on the inter-block path should be considered. Further, block areas of source and sink blocks and levels of logic attached to the block ports in the source and sink blocks should also be considered. The levels of logic of a block can be the maximum number of logic gates between a block port and a flip-flop stage. In an embodiment of the invention, the logic gates can be specifically non-sequential logic gates. It can be more difficult for a block with a larger area and levels of logic to fulfill the timing constraints than for a block with a smaller area and levels of logic. Therefore, the block with a larger area and levels of logic should be given more lenient timing constraints. Then the placement/synthesis tool can more easily create the optimal timing results even for the block with the large area and levels of logic.

Figure 1:
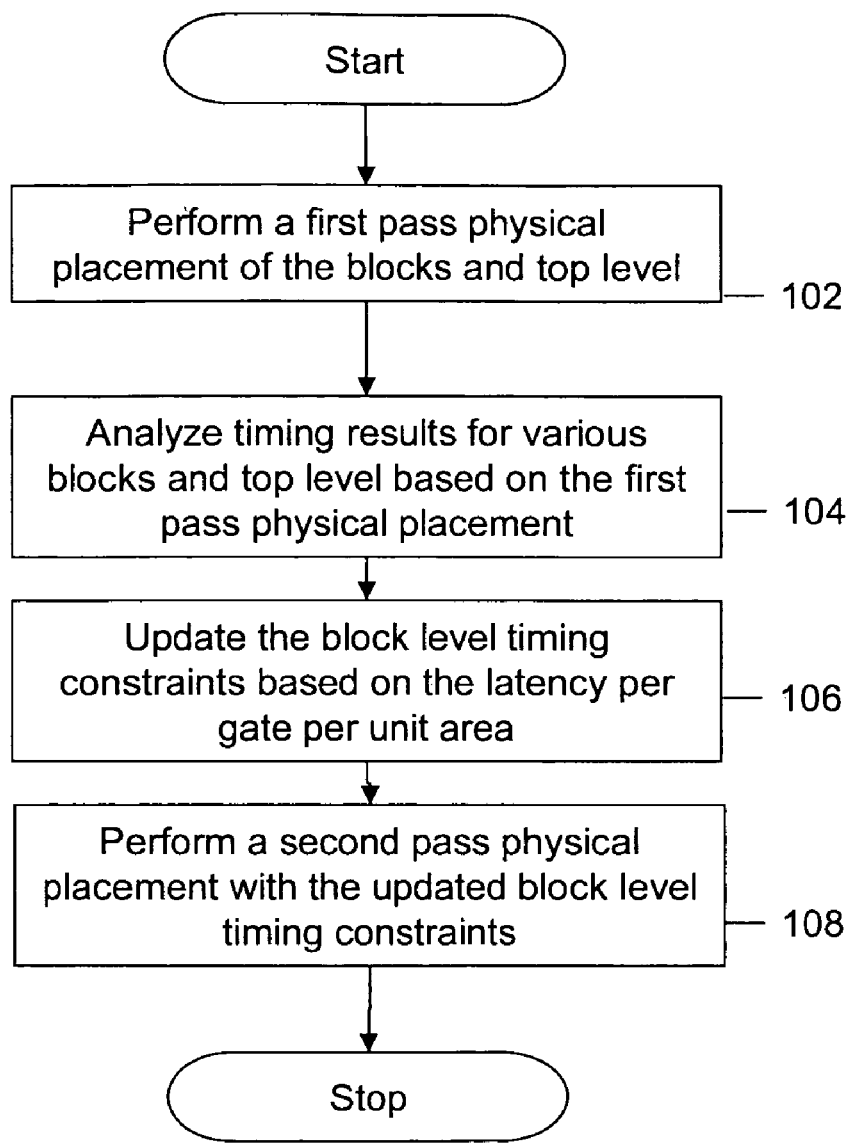
FIG. 1 is a flowchart depicting an overview of the method for physical placement of an integrated circuit based on the timing constraints, in accordance with an embodiment of the invention.

FIG. 1 is a flowchart depicting an overview of the method for physical placement of an integrated circuit based on the timing constraints, in accordance with an embodiment of the invention. At step 102, a first pass of the physical placement of the top level and various blocks in the integrated circuit can be performed. In an embodiment of the invention, the block level timing constraints can be such that they allow a full clock cycle for the block portions of an inter-block path while performing the first pass of the physical placement. In an embodiment of the invention, electrical correction in the physical placement can also be performed while performing step 102.

At step 104, the timing results of various blocks and of the top level can be analyzed, based on the first pass physical placement to identify a set of parameters. In an embodiment of the invention, the set of parameters can include the slacks associated with the inter-block paths, and the latency associated with each block portion of the inter-block paths. The slack can be defined as the difference between the required time and the arrival time of a signal. In an embodiment of the invention the slack can be the lowest slack associated with the top-level net forming the inter-block path. The latency through the source block portion of the inter-block path can be defined as the time that the signal takes to travel between the final flip-flop stage in the source block and the source block port. Similarly latency through the sink block portion of the inter-block path can be defined as the time that the signal takes to travel between the sink block port and a first flip-flop stage in sink block. At step 106, the block level timing constraints that allowed a full cycle for the block portions of the inter-block path can be updated, based on the set of parameters and the LPGA of various block ports. A block port can be an I/O port of a block. The LPGA of the block port is based on the latency through the block portion of the inter-block path, area of the block, and the levels of logic associated with the block port. The following is the mathematical expression for the LPGA:

$$LPGA = latency/(levels\ of\ logic * block\ area); \quad (1)$$

wherein the block area is the area of the block under consideration, and the levels of logic can indicate the maximum number of gates between a block port of a block and a node in the block. In an embodiment of the invention, the node can be the final flip-flop stage for the source block and the first flip-flop stage for the sink block. In an embodiment of the invention, the block level timing constraints can be updated by assigning zero slack for the top-level portion of the inter-block paths. The remaining slack of the inter-block path can then be divided between the source block portion and the sink block portion of the inter-block path based on the calculated LPGA of the source and sink block ports.

In an embodiment of the invention the latency associated with each block portion of the inter-block path can be determined based on one or more variables. The variables for determining the latency include, but are not limited to the following:

The clock input arrival time at the flip-flop stage of the source block with the lowest amount of slack The observed arrival time at the output port of the source block The observed arrival time at the input port of the sink block The arrival time at the flip-flop stage of the sink block with the lowest amount of slack At step 108, a second pass of the physical placement can be performed based on the updated block level timing constraints. The second pass of the physical placement can use these updated and enhanced timing constraints of the blocks to generate optimal timing results.

In an embodiment of the invention, the method can be performed for an integrated circuit, which is synthesized according to hierarchical physical design methodology. In the hierarchical physical design methodology, the integrated circuit can be synthesized by partitioning the integrated circuit in one or more levels of hierarchy.

In various embodiments of the invention, the node is assumed to be a flip-flop stage but the invention does not limit only to a flip-flop stage. In various embodiments of the invention, examples of the node may include a latch, a block port and a memory storage element such as a register array, a Static random access memory (SRAM) element, and an embedded Dynamic random access memory element (DRAM).

Figure 2:
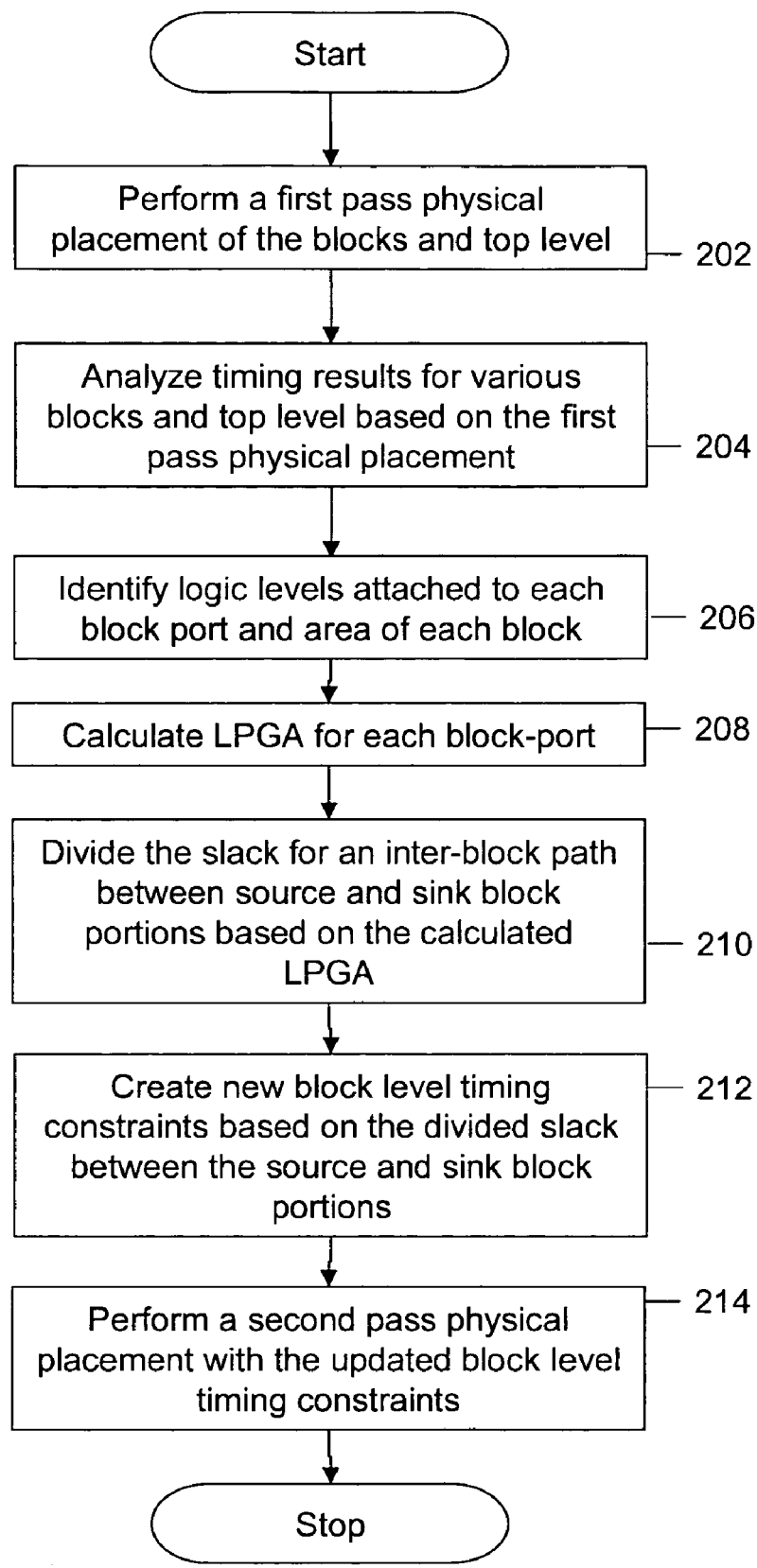
FIG. 2 is a flowchart depicting a detailed method for physical placement of an integrated circuit based on the timing constraints, in accordance with an embodiment of the invention.

FIG. 2 is a flowchart depicting a detailed method for physical placement of an integrated circuit based on the timing constraints, in accordance with an embodiment of the invention. At step 202, a first pass of the physical placement of the blocks and the top level in the integrated circuit, is performed. In an embodiment of the invention, electrical correction in the physical placement can also be performed while performing step 202. As described in conjunction with FIG. 1, the block level timing constraints allow a full-clock cycle for the block portions of the inter-block path while performing step 202. At step 204, the timing results of the top level and various blocks can be analyzed, based on the first pass physical placement to identify a set of parameters. In an embodiment of the invention, the set of parameters can include the slacks associated with the inter-block path, and the latency associated with each block portion of the inter-block path. As mentioned earlier, the slack can be the lowest slack associated with the top-level net forming the inter-block path. In an embodiment of the invention, the latency for each block portion of the inter-block path can be the latency corresponding to the lowest slack. At step 206, the identification of levels of logic attached to each block port and the area of each of the blocks can be performed. In an embodiment of the invention, the levels of logic can be the maximum number of logic gates between a block port and a flip-flop. In another embodiment of the invention, the logic gates can be specifically non-sequential logic gates.

At step 208, the LPGA of each block port of a block can be computed by using the identified levels of logic and the block area. The LPGA is computed by using equation (1), as described in conjunction with FIG. 1. At step 210, the slack of an inter-block path that corresponds to the lowest slack for the top-level net forming the inter-block path can be divided optimally between the source block portion and the sink block portion. In various embodiments of the invention, the slack can be the result of a setup test performed on the inter-block path. The slack can be positive or negative. A positive slack implies that the setup test has passed, while a negative slack implies that the setup test has failed. In accordance with an embodiment of the invention, the distribution of the slack between the source and sink block portions depends on the type of slack. As explained earlier, a block portion of the inter-block path belonging to a block with larger block area and larger levels of logic should be less constrained because the placement/synthesis tool will have a more difficult time producing an optimal solution for such block. A less constrained block portion can be obtained by assigning more positive slack to the block portion of an inter-block path with a positive slack. Similarly, the less constrained block portion can be obtained by assigning a less negative slack to the block portion of an inter-block path with the negative slack.

If the slack is positive, the equations used to divide it between the source and sink block portions can be:

$$Slack_{sink}=Slack*LPGA_{source}/(LPGA_{sink}+LPGA_{source}) \quad (2)$$

$$Slack_{source}=Slack*LPGA_{sink}/(LPGA_{sink}+LPGA_{source}) \quad (3)$$

wherein $Slack_{sink}$ is the amount of Slack assigned to the sink block portion of the inter-block path that can be used while creating the new block level timing constraints; Slack is the lowest slack for the top-level net forming the inter-block path; $LPGA_{source}$ is the LPGA of a block port of the source block; $LPGA_{sink}$ is the LPGA of a block port of the sink block; and $Slack_{source}$ is the amount of Slack assigned to the source block portion of the inter-block path that can be used while creating the new block level timing constraints.

If the slack is negative, the equations used for dividing it between the source and the sink block portions can be:

$$Slack_{sink}=Slack*LPGA_{sink}/(LPGA_{sink}+LPGA_{source}) \quad (4)$$

$$Slack_{source}=Slack*LPGA_{source}/(LPGA_{sink}+LPGA_{source}) \quad (5)$$

At step 212, the new block level timing constraints can be created based on the divided slack of the source and sink block portions. The equations for the same are as follows:

$$ReqArrivaltime=Arrival\ time_{source\ port}+Slack_{source} \quad (6)$$

$$Input\ Delay=Arrival\ time_{sink\ port}+Slack-Slack_{sink} \quad (7)$$

wherein, equation (6) is used for the source block ports and equation (7) is used for the sink block ports. ReqArrivaltime is the time when the signal is required to arrive at the source port, and Input Delay is the time when the signal leaves from the sink port. Arrival time$_{source\ port}$/Arrival time$_{sink\ port}$ is the observed arrival time at the source block port/sink block port from the analysis of the timing results obtained by the first pass of the physical placement.

At step 214, a second pass of physical placement can be performed using the updated block level timing constraints according to equations (6) and (7). This results in the optimal placement of the various blocks in the integrated circuit.

Figure 3:
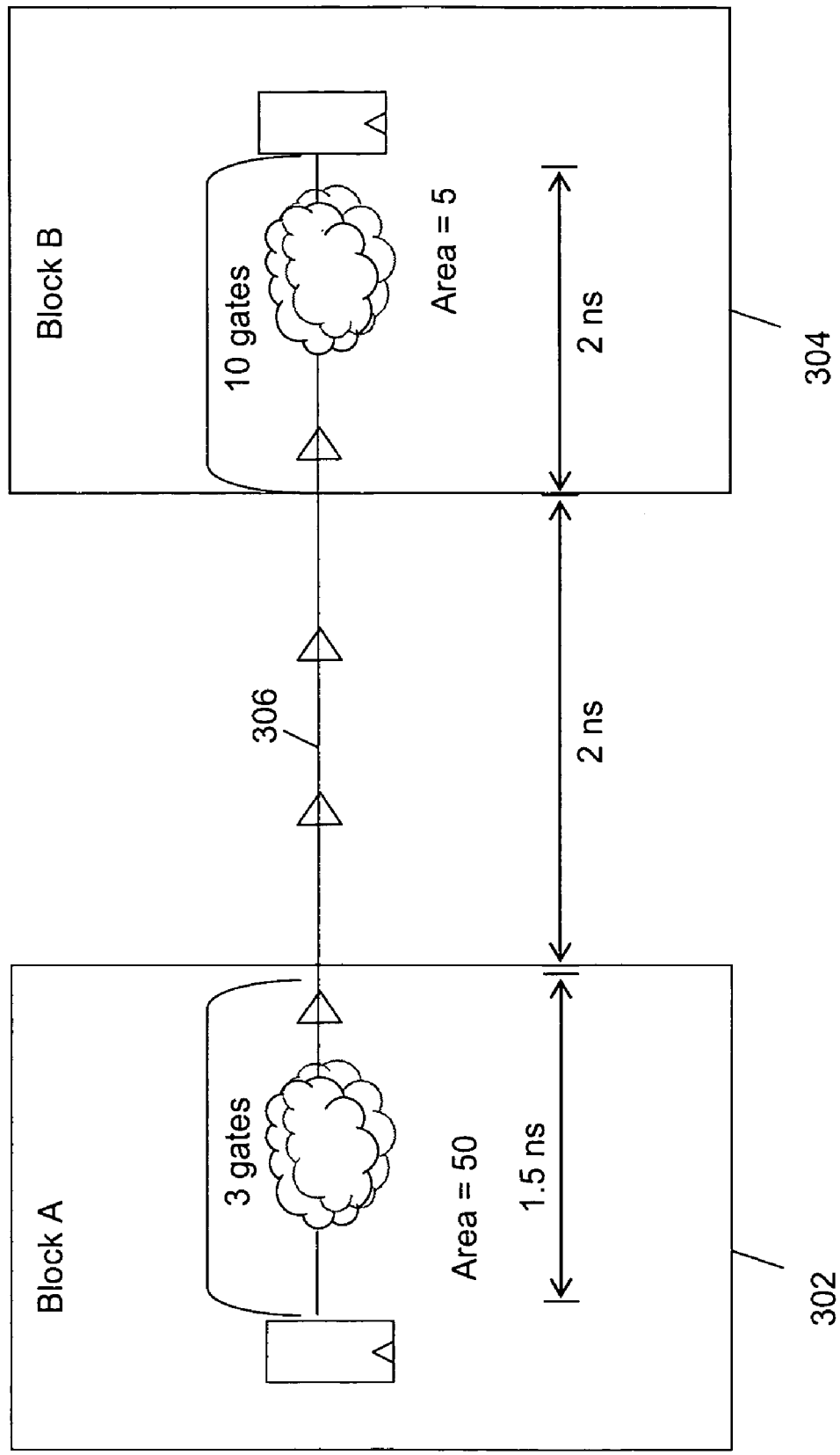
FIG. 3 illustrates a block diagram depicting the definitions of various parameters needed for calculation of Latency per Gate per unit area.

FIG. 3 illustrates a block diagram depicting the definitions of various parameters needed to calculate LPGA. In accordance with an embodiment of the invention, a source block 302 has a path latency of 1.5 ns, comprises three gates (maximum levels of logic are equal to three), and covers an area equivalent to 50 units. Similarly, a sink block 304 comprises 10 gates (maximum levels of logic are equal to 10), has a path latency of 2 ns, and covers an area of 5 units. Source block 302 and sink block 304 are connected through a top level net 306, which forms an inter-block path for these blocks. The LPGA associated with the block ports attached to top level net 306 is computed by using equation (1). The computed values of the $LPGA_{source}$ and the $LPGA_{sink}$ are 0.01 and 0.04, respectively. After computing the LPGAs, the slack is distributed between source block 302 portion and sink block 304 portion of the inter-block path formed by top level net 306. In an embodiment of the invention, the slack may be assumed to be equal to 1 ns. According to this embodiment, the slack is a positive quantity. Therfore, equations (2) and (3) can be used for distributing slack. The slack values formed are the following:

$$Slack_{Sink}=1*(0.01)/(0.01+0.04)=0.2\ ns$$

$$Slack_{Source}=1*(0.04)/(0.01+0.04)=0.8\ ns$$

In the example cited above, the LPGA of the block port of the source block is less than the LPGA of the block port of the sink block. Equation (1) shows that the block area and levels of logic are inversely proportional to the LPGA. Therefore, smaller LPGA of the block port of the source block can indicate either larger area of the source block or more levels of logic attached to the block port of the source block. As area of the block and levels of logic increase, the more difficult it will be for the placement/synthesis tool to create the optimal timing results. Therefore, source block portion of the inter-block path should be less constrained as it has smaller LPGA. This can be achieved by assigning more positive slack to the source block portion.

In an alternative embodiment of the invention, the method, as described in FIG. 1 and FIG. 2 can also be performed for 'point to multi-point' paths in the IC. In accordance with an embodiment of the invention, the 'point to multi-point' paths can exist in the IC, when top-level nets fan out to multiple block ports. The multiple block ports can further belong to one or more blocks in the IC.

Figure 4:
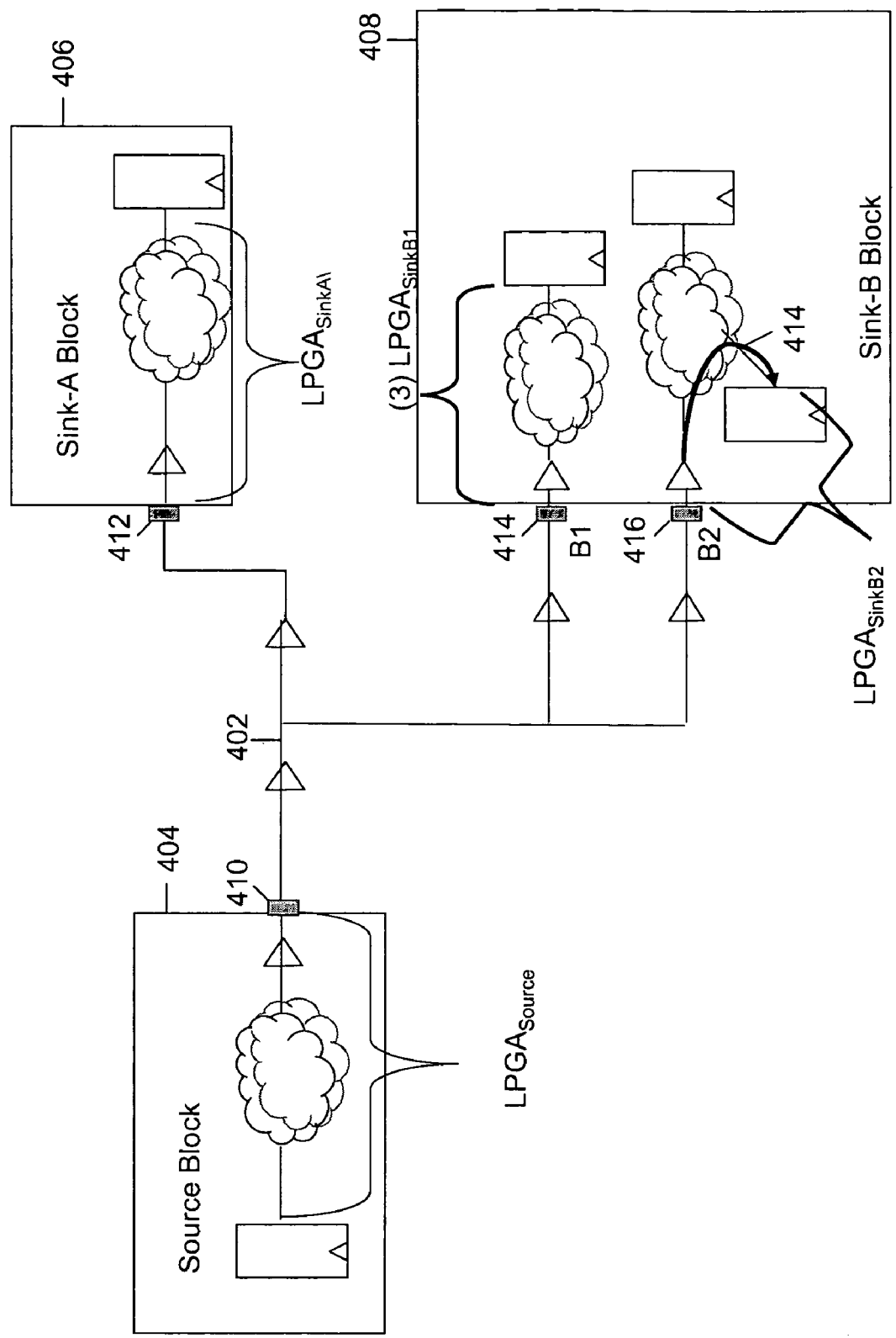
FIG. 4 illustrates a block diagram depicting a 'point to multi-point' path according to a top-level net connecting a plurality of blocks.

FIG. 4 illustrates a block diagram depicting a 'point to multipoint path' formed by a top-level net 402 connecting a plurality of blocks. A source block 404 is connected to a sink-A block 406 and a sink-B block 408 by top-level net 402. Top-level net 402 fans out to a port 412 of sink-A block 406. Further, top-level net 402 fans out to a port 414 and a port 416 of sink-B block 408. The block level timing constraints can be updated for the 'point to multipoint' path formed by top-level net 402 by calculating the LPGA of a port 410 of source block 404, $LPGA_{Source}$; the LPGA of port 412 of sink-A block 406, $LPGA_{SinkA}$; the LPGA of port 414 of sink-B block 408, $LPGA_{SinkB1}$; and the LPGA of port 416 of sink-B block 408, $LPGA_{SinkB2}$. Then the slack of top-level net 402 can be distributed among source block 404, sink-A block 406, sink-B block 408 based on their respective LPGAs. For example, the slack of sink-A block 406 can be calculated based on $LPGA_{Source}$ and $LPGA_{SinkA}$. In accordance with an embodiment of the invention, to calculate the slack of source block portions in 'point to multi-point' paths, LPGAs according to the worst timing path are considered. A worst timing path is a path that has the least amount of positive slack among all the paths from a sink block port to a flip-flop stage. For example, the slack of source block 404 can be calculated based on $LPGA_{Source}$, and $LPGA_{SinkB2}$. $LPGA_{SinkB2}$ is chosen from among $LPGA_{SinkA}$, $LPGA_{SinkB1}$, and $LPGA_{SinkB2}$ to calculate slack of source block 404 because the path from a route 414, as shown in FIG. 4, results in the worst timing path.

Figure 5:
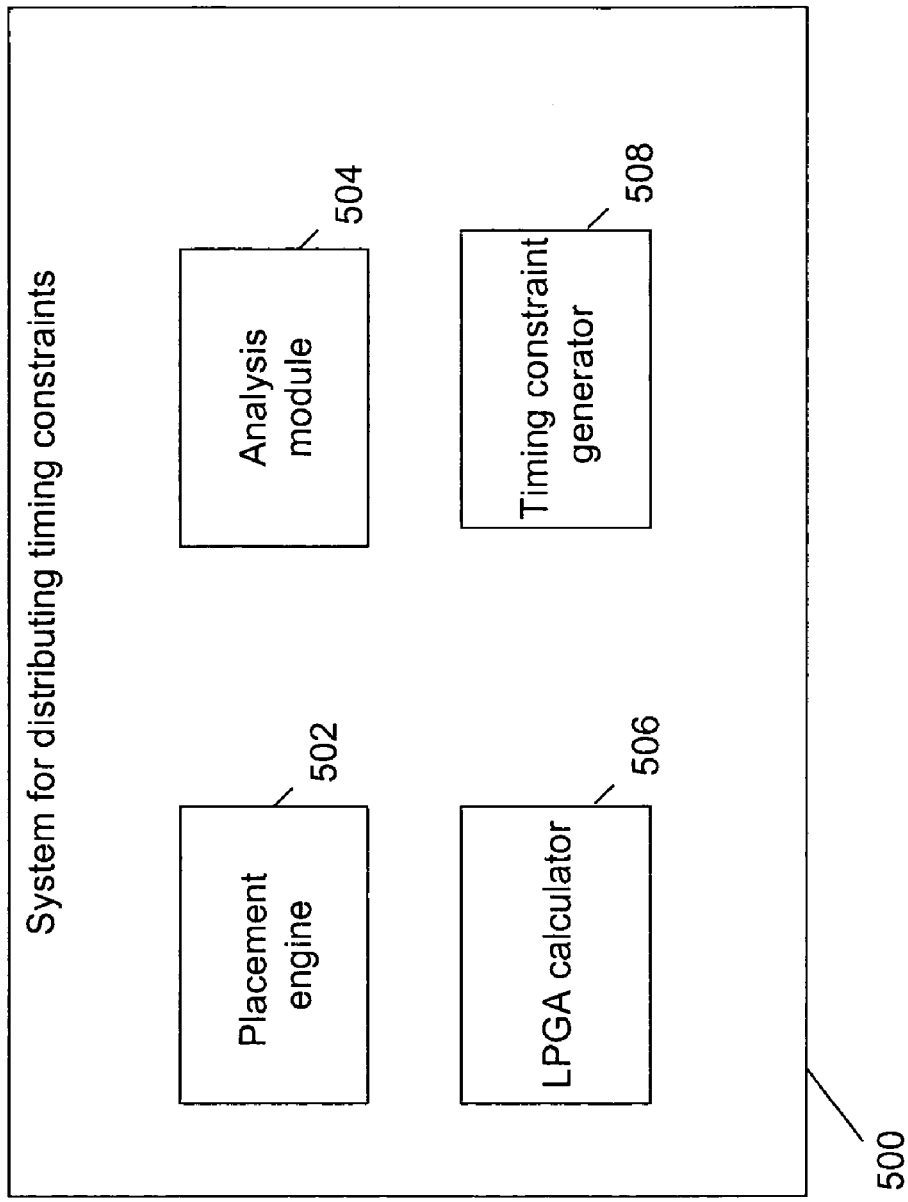
FIG. 5 illustrates a block diagram depicting the system for physical placement of an integrated circuit based on the timing constraints, in accordance with an embodiment of the invention.

FIG. 5 illustrates a block diagram depicting a system for physical placement of an integrated circuit based on the timing constraints, in accordance with an embodiment of the invention. System 500 can include a placement engine 502, an analysis module 504, an LPGA calculator 506, and a timing constraint generator 508. Placement engine 502 can physically place the top level and various blocks of the integrated circuit and can perform a first pass of the physical placement of the IC. Analysis module 504 can analyze the timing results of the top level and the blocks in the integrated circuit, based on the first pass placement of the top level and the blocks to identify a set of parameters. In an embodiment of the invention, the set of parameters can include the slacks associated with the inter-block path, and the latency associated with each block portion of the inter-block path. LPGA calculator 506 can calculate the LPGA of the various block ports, based on the area of the blocks, the levels of logic attached to the block ports of the blocks, and the latency of the block portions of various inter-block paths. Timing constraint generator 508 can update the block level timing constraints based on the set of parameters and the LPGAs of various block ports. In an embodiment of the invention, timing constraint generator 508 can assign zero slack for the top-level portion of the inter-block path. In another embodiment of the invention, while updating the block level timing constraints, timing constraint generator 508 can divide the slack of an inter-block path between the source and sink block portions of the inter-block path. Further, timing constraint generator 508 can create new block level timing constraints based on the divided slack between the source and sink block portions. Placement engine 502 can subsequently perform a second pass, based on the updated block level timing constraints. In various embodiments of the invention, all the system elements of system 500 can be implemented as software modules. In an embodiment of the invention, system 500 can be implemented as a part of an electronic design automation (EDA) tool.

Embodiments of the present invention have the advantage that timing budgets can be optimally and automatically distributed to the top-level and block portions of inter-block paths. This solves the problem of poor optimization on inter-block paths in a hierarchical Physical Design (PD) methodology. The LPGA provides a way to optimally distribute the slack of an inter-block path. The top-level portion of the inter-block path only connects the block ports and does not contain any logic circuitry; therefore no more slack than necessary for the top-level portion should be assigned to it. The embodiments of the invention have the provision of assigning zero slack for the top-level portion of the inter-block path after first pass analysis. This results in optimal second pass approach for physical placement.

Another advantage of the embodiments of the invention is the enablement of designs of greater complexity and higher performance in a given integrated circuit. The embodiments of the invention achieve the advantage mentioned above, by determining the timing budgets hierarchically in the integrated circuit. In a hierarchical PD methodology processing can be carried out simultaneously for various levels of hierarchy. Therefore, the hierarchical PD methodology can facilitate the design of larger and complex ICs. Embodiments of the invention intend to avoid manual writing of block level timing constraints by automating the process of writing them. The embodiments of the invention take a holistic view of the inter-block paths and compute the optimal block level timing constraints. This enables a designer to add complexity in the design and still meet the timing criteria.

Another advantage of the embodiments of the invention is the reduction in the number of iterations conducted to design highly complex circuits with millions of logical gates. The method described in the invention uses a two-pass approach, wherein the timing constraints are noticed and updated automatically before the second pass of the physical placement, based on the timing results of the first pass of the physical placement. In accordance with various embodiments of the invention, as the timing constraints for the second pass are based on design factors such as the block area and levels of logic, they can change dynamically with the design. This results in a fewer number of iterations of placement and analysis than in the case of conventional techniques that use a trial and error approach to perform optimal timing closure.

While performing physical placement of an IC, it is necessary to obtain optimal timing constraints. Because if an inter-block path remains over-constrained then the flip-flop stage will be placed very close to the port in the block to fulfill the timing constraints. This may result in additional stress on a path internal to the block. Embodiments of the invention have the advantage that optimal block level timing constraints can aid in the timing performance of the inter-block paths and also of the paths internal to the blocks.

Although the invention has been discussed with respect to specific embodiments thereof, these embodiments are merely illustrative, and not restrictive, of the invention.

Any suitable programming language can be used to implement the routines of the present invention including C, C++, Java, assembly language, etc. Different programming techniques such as procedural or object oriented can be employed. The routines can execute on a single processing device or multiple processors. Although the steps, operations, or computations may be presented in a specific order, this order may be changed in different embodiments. In some embodiments, multiple steps shown sequentially in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Also in the description herein for embodiments of the present invention, a portion of the disclosure recited in the specification contains material, which is subject to copyright protection. Computer program source code, object code, instructions, text or other functional information that is executable by a machine may be included in an appendix, tables, figures or in other forms. The copyright owner has no objection to the facsimile reproduction of the specification as filed in the Patent and Trademark Office. Otherwise all copyright rights are reserved.

A 'computer' for purposes of embodiments of the present invention may include any processor-containing device, such as a mainframe computer, personal computer, laptop, notebook, microcomputer, server, personal data manager or 'PIM' (also referred to as a personal information manager), smart cellular or other phone, so-called smart card, set-top box, or any of the like. A 'computer program' may include any suitable locally or remotely executable program or sequence of coded instructions, which are to be inserted into a computer, well known to those skilled in the art. Stated more specifically, a computer program includes an organized list of instructions that, when executed, causes the computer to behave in a predetermined manner. A computer program contains a list of ingredients (called variables) and a list of directions (called statements) that tell the computer what to do with the variables. The variables may represent numeric data, text, audio or graphical images. If a computer is employed for presenting media via a suitable directly or indirectly coupled input/output (I/O) device, the computer would have suitable instructions for allowing a user to input or output (e.g., present) program code and/or data information respectively in accordance with the embodiments of the present invention.

A 'computer readable medium' for purposes of embodiments of the present invention may be any medium that can contain, store, communicate, propagate, or transport the computer program for use by or in connection with the instruction execution system apparatus, system or device.

The computer readable medium can be, by way of example only but not by limitation, an electronic, magnetic, optical, electromagnetic, infrared, or semiconductor system, apparatus, system, device, propagation medium, or computer memory.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Further, at least some of the components of an embodiment of the invention may be implemented by using a programmed general-purpose digital computer, by using application specific integrated circuits, programmable logic devices, or field programmable gate arrays, or by using a network of interconnected components and circuits. Connections may be wired, wireless, by modem, and the like.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/figures should be considered only as exemplary, and not limiting, unless otherwise specifically noted. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims

What is claimed is:

1. A method for physical placement of an integrated circuit based on timing constraints, the method comprising
    performing a first pass physical placement of a top level and a plurality of blocks by allowing a full clock cycle for a plurality of block portions of an inter-block path, the inter-block path belonging to one or more inter-block paths in the integrated circuit, the inter-block path being a path between a source block and a sink block;
    analyzing timing results associated with the top level and the plurality of blocks of the integrated circuit based on the first pass physical placement to identify a set of parameters;
    updating block level timing constraints for the integrated circuit based on the set of parameters and latency per gate per unit area (LPGA) of each block port of a plurality of block ports; and
    performing a second pass physical placement with the updated block level timing constraints.

2. The method of claim 1, wherein the method being performed for an integrated circuit being synthesized according to a hierarchical physical design methodology.

3. The method of claim 1, wherein the performing a first pass of the physical placement further comprises performing electrical correction in the physical placement.

4. The method of claim 1, wherein the timing results are analyzed to identify a set of parameters, the set of parameters comprising
    associated with each inter-block path, the slack being the lowest slack associated with a top-level net forming said inter-block path; and
    latency associated with each of the plurality of block portions of each of the one or more inter-block paths.

5. The method of claim 4, wherein the set of parameters comprises the latency associated with each of the plurality of the block portions, the latency being determined based on one or more variables, the one or more variables being selected from a group comprising clock input arrival time at a flip-flop stage of a source block with the lowest amount of slack, observed arrival time at output port of the source block, observed arrival time at input port of the sink block, and the arrival time at the flip-flop stage of the sink block with the lowest amount of slack.

6. The method of claim 1, wherein the updating block level timing constraints comprises
    identifying levels of logic attached to each of the plurality of block ports;
    identifying area of each of the plurality of blocks;
    calculating LPGA of each of the plurality of block ports;
    dividing slack of the one or more inter-block paths between source block portions and sink block portions based on the calculated LPGA of the source block ports and the sink block ports; and
    creating new block level timing constraints based on the divided slack between the source block portions and the sink block portions of the one or more inter-block paths.

7. The method according to claim 6, wherein the levels of logic attached to a block port of a block being the maximum number of logic gates between the block port and a node in the block.

8. The method according to claim 7, wherein for the source block the node being the final flip-flop stage, and for the sink block the node being the first flip-flop stage.

9. The method of claim 6, wherein the LPGA of a block port is based on the levels of logic attached to the block port, area of the block, and the latency associated with a block portion of the inter-block path, the block portion belonging to the block.

10. The method of claim 1, wherein the updating the block level timing constraints further comprises assigning zero slack for the top-level portion of each of the one or more inter-block paths.

11. The method of claim 1, wherein the block level timing constraints being required arrival time at a source block port and input delay at a sink block port.

12. The method of claim 1 being performed for a point to multipoint path, the point to multipoint path comprising a top level net fanning out to multiple block ports, the multiple block ports corresponding to one or more blocks.

13. An Electronics Design Automation (EDA) tool for physical placement of an integrated circuit based on timing constraints, the EDA tool comprising
 a placement engine for performing a first pass physical placement and a second pass physical placement of the integrated circuit, the placement engine being capable of placing a top level and a plurality of blocks by allowing a full clock cycle for a plurality of block portions of an inter-block path while performing the first pass physical placement, the inter-block path belonging to one or more inter-block paths in the integrated circuit;
 an analysis module for analyzing timing results associated with the top level and the plurality of blocks in the integrated circuit based on the first pass physical placement to identify a set of parameters;
 an LPGA calculator for calculating latency per gate per unit area (LPGA) of each block port of a plurality of block ports; and
 a timing constraint generator for updating block level timing constraints for the integrated circuit based on the set of parameters and LPGAs of the plurality of block ports, a block port of the plurality of block ports being one of an input port of a block and an output port of the block.

14. A system for physical placement of an integrated circuit based on timing constraints, the system comprising
 means for performing a first pass physical placement of a top level and a plurality of blocks by allowing a full clock cycle for a plurality of block portions of an inter-block path belonging to one or more inter-block paths in the integrated circuit;
 means for analyzing timing results associated with top level and the plurality of blocks of the integrated circuit based on the first pass physical placement to identify a set of parameters;
 means for updating block level timing constraints for the integrated circuit based on the set of parameters and latency per gate per unit area (LPGA) of each block port of a plurality of block ports, a block port of the plurality of block ports being one of an input port of a block and an output port of the block; and
 means for performing a second pass physical placement with the updated block level timing constraints.

15. An apparatus for physical placement of an integrated circuit based on timing constraints, the apparatus comprising
 a processing system including a processor coupled to a display and user input device;
 a machine-readable medium including instructions executable by the processor comprising
  one or more instructions for performing a first pass physical placement of the top level and a plurality of blocks by providing a full clock cycle for a plurality of block portions of an inter-block path belonging to one or more inter-block paths in the integrated circuit;
  one or more instructions for analyzing timing results associated with a top level and the plurality of blocks of the integrated circuit based on the first pass physical placement to identify a set of parameters;
  one or more instructions for updating block level timing constraints for the integrated circuit based on the set of parameters and latency per gate per unit area (LPGA) of each block port of a plurality of block ports, a block port of the plurality of block ports being one of an input port of a block and an output port of the block; and
  one or more instructions for performing a second pass physical placement with the updated block level timing constraints.

16. A machine-readable medium including instructions executable by a processor comprising
 one or more instructions for performing a first pass physical placement of a top level and a plurality of blocks by providing a full clock cycle for a plurality of block portions of an inter-block path belonging to one or more inter-block paths in the integrated circuit;
 one or more instructions for analyzing timing results associated with the top level and the plurality of blocks of the integrated circuit based on the first pass physical placement to identify a set of parameters;
 one or more instructions for updating block level timing constraints for the integrated circuit based on the set of parameters and latency per gate per unit area (LPGA) of each of a plurality of block ports, a block port of the plurality of block ports being one of an input port of a block and an output port of the block; and
 one or more instructions for performing a second pass physical placement with the updated block level timing constraints.

* * * * *